United States Patent
Hua et al.

(10) Patent No.: US 7,489,033 B2
(45) Date of Patent: Feb. 10, 2009

(54) ELECTRONIC ASSEMBLY WITH HOT SPOT COOLING

(75) Inventors: Fay Hua, Fremont, CA (US); Carl L. Deppisch, Chandler, AZ (US); Joni G. Hansen, Phoenix, AZ (US); Youzhi E. Xu, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 7 days.

(21) Appl. No.: 11/558,504

(22) Filed: Nov. 10, 2006

(65) Prior Publication Data

US 2008/0111234 A1 May 15, 2008

(51) Int. Cl.
*H01L 23/10* (2006.01)

(52) U.S. Cl. .................... 257/704; 257/706; 257/707; 257/710; 257/E23.051

(58) Field of Classification Search .............. 257/704, 257/706, 707, 710, 712, E23.051, E23.087
See application file for complete search history.

(56) References Cited

U.S. PATENT DOCUMENTS 6,706,562 B2 * 3/2004 Mahajan et al. ............. 438/125
7,328,508 B2 * 2/2008 Edwards et al. ........... 29/890.03

* cited by examiner

*Primary Examiner*—Sue A Purvis
*Assistant Examiner*—Selim Ahmed
(74) *Attorney, Agent, or Firm*—Schwegman, Lundberg & Woessner, P.A.

(57) ABSTRACT

A composite of two or more thermal interface materials ("TIMs") is placed between a die and a heat spreader to improve cooling of the die in an integrated circuit package. The two or more TIMs vary in heat-dissipation capability depending upon the locations of die hot spots. In an embodiment, a more thermally conductive material may be positioned over one or more die hot spots, and a less thermally conductive material may be positioned abutting and/or surrounding the more thermally conductive material. The two or more TIMs may comprise a solder and a polymer. The composite TIM may be preformed as one unit or as a plurality of units. Methods of fabrication, as well as application of the package to an electronic assembly and to an electronic system, are also described.

13 Claims, 6 Drawing Sheets

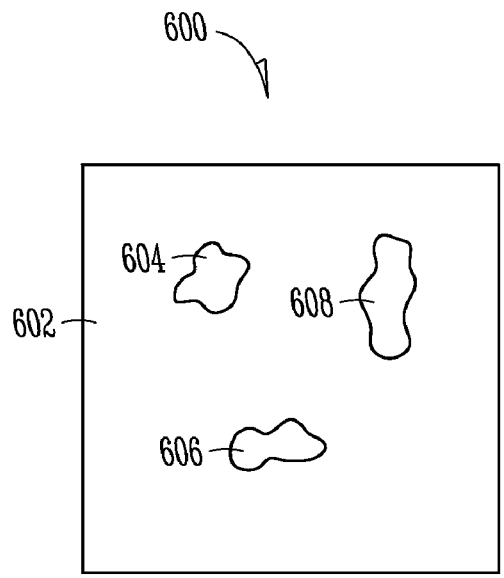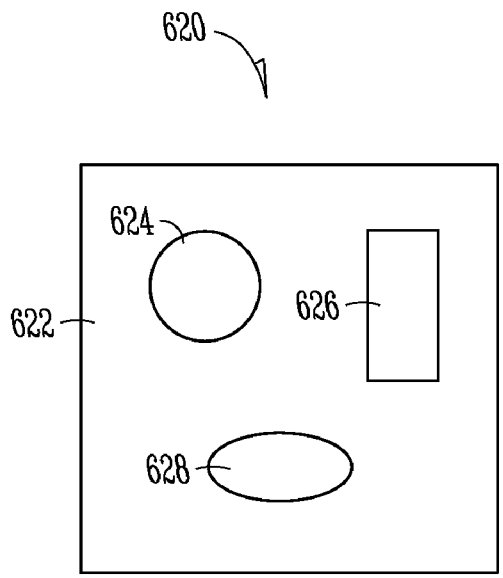
*FIG. 8*  *FIG. 9*
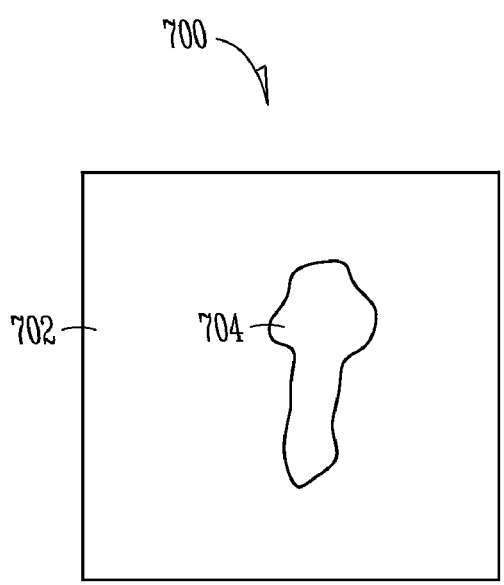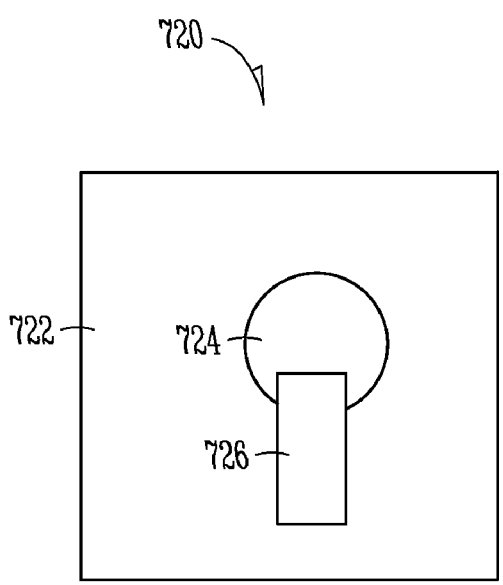
*FIG. 10*  *FIG. 11*

ELECTRONIC ASSEMBLY WITH HOT SPOT COOLING

TECHNICAL FIELD

The subject matter relates generally to electronics packaging and, more particularly, to an electronics package with hot spot cooling with a composite thermal interface material ("TIM") between a die and a heat spreader, and to manufacturing methods related thereto.

BACKGROUND INFORMATION

One or more integrated circuits ("IC") dice may be assembled into an IC package by physically and electrically coupling them to a substrate made of organic or ceramic material. One or more IC packages may be physically and electrically coupled to a printed circuit board ("PCB") to form an "electronic assembly". The "electronic assembly" may be part of an "electronic system". An "electronic system" is broadly defined herein as any product comprising an "electronic assembly". Examples of electronic systems include computers (e.g., server, router, desktop, laptop, hand-held, Web appliance, etc.), wireless communications devices (e.g., cellular phone, cordless phone, pager, etc.), computer-related peripherals (e.g., printer, scanner, monitor, etc.), entertainment devices (e.g., television, radio, stereo, tape and compact disc players, video cassette recorder, camcorder, digital camera, MP3 (Motion Picture Experts Group, Audio Layer 3) player, etc.), and the like.

An IC package may comprise one or more IC dice. At least one surface of a die may be positioned against a TIM to couple the die thermally to another element, such as a heat spreader or heat sink. A TIM may be used to improve performance and long-term reliability by thermally coupling the IC die to the heat sink for improved thermal transfer.

In the field of electronics there is competitive pressure among manufacturers to drive the performance of their equipment up while driving production costs down and maintaining acceptable yield and reliability. This is particularly true regarding the packaging of dice on substrates, where each new generation of packaging is expected to provide increased performance, particularly in terms of higher clock frequencies, while generally being smaller or more compact in size.

The combination of higher operational frequencies, while concurrently maintaining or decreasing chip size, increases the heat dissipation requirement for associated packaging.

BRIEF DESCRIPTION OF THE DRAWINGS

FIG. 8 illustrates a top view representation of an IC die.

FIG. 9 illustrates a top view representation of a layer of TIMs for an IC die with hot spot cooling, in accordance with an embodiment of the invention.

FIG. 10 illustrates a top view representation of an IC die.

FIG. 11 illustrates a top view representation of a layer of TIMs for an IC die with hot spot cooling, in accordance with an embodiment of the invention.

DETAILED DESCRIPTION

In the following detailed description of embodiments of the subject matter, reference is made to the accompanying drawings, which form a part hereof, and in which is shown by way of illustration specific preferred embodiments in which the subject matter may be practiced. These embodiments are described in sufficient detail to enable those skilled in the art to practice the subject matter, and it is to be understood that other embodiments may be utilized and that structural, mechanical, compositional, electrical, and procedural changes may be made without departing from the spirit and scope of the subject matter. The following detailed description is, therefore, not to be taken in a limiting sense, and the scope of the subject matter is defined only by the appended claims.

In an IC package that comprises a high performance IC die, there is a likelihood that hot spots will form on the die during operation. Uncontrolled heat may decrease IC package performance and adversely affect the long term reliability of the IC package.

The subject matter provides a solution to certain hot spot cooling problems that may be associated with packaging of ICs. In an embodiment, a composite of two or more TIMs is placed between a die and a heat spreader. The two or more TIMs may vary in heat-dissipation capability depending upon the location(s) of die hot spots. A more thermally conductive material may be positioned over one or more die hot spots, and a less thermally conductive material may be positioned abutting and/or surrounding the more thermally conductive material. The composite TIM may be preformed either as one unit or a plurality of units. The two or more TIMs may comprise a solder and a polymer. Various embodiments are illustrated and described herein, including methods of fabrication, as well as application of an IC package to an electronic assembly and to an electronic system.

Figure 1:
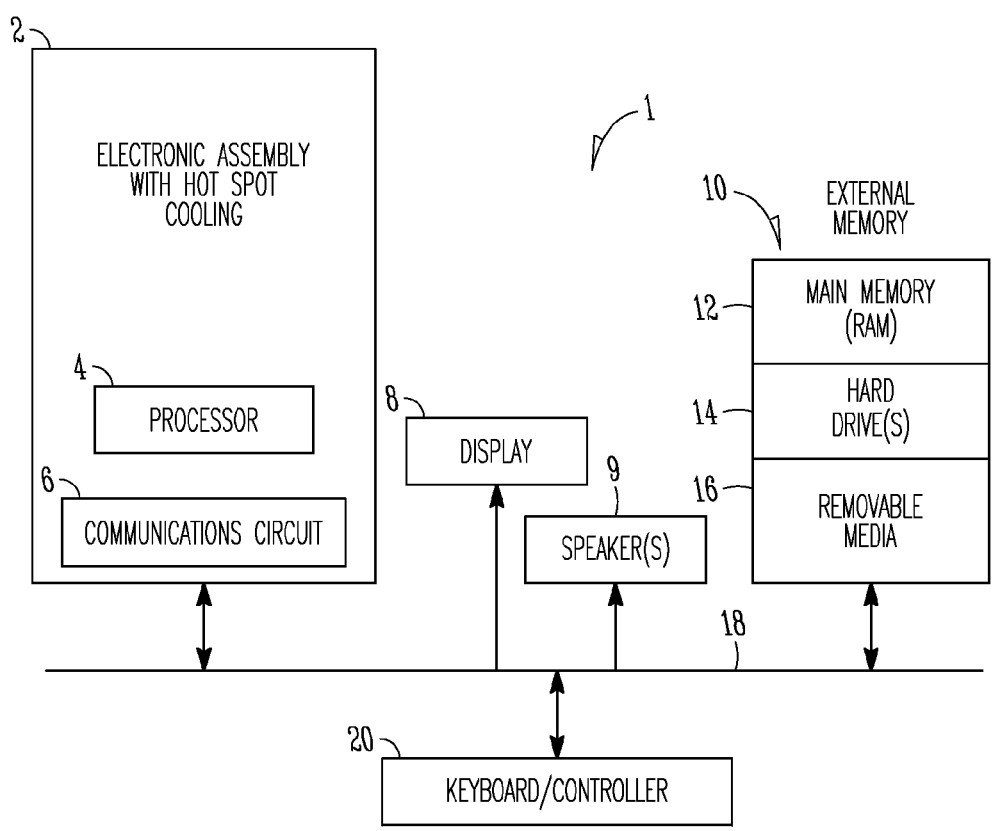
FIG. 1 is a block diagram of an electronic system incorporating at least one electronic assembly with a hot spot cooling IC package, in accordance with an embodiment of the subject matter.

FIG. 1 is a block diagram of an electronic system 1 incorporating at least one electronic assembly 2 with a hot spot cooling IC package, in accordance with an embodiment of the subject matter. Electronic system 1 is merely one example of an electronic system in which the subject matter may be used. In this example, electronic system 1 comprises a data processing system that includes a system bus 18 to couple various components of the system. System bus 18 provides communications links among various components of the electronic system 1 and may be implemented as a single bus, as a combination of busses, or in any other suitable manner.

"Suitable", as used herein, means having characteristics that are sufficient to produce the desired result(s). Suitability for the intended purpose can be determined by one of ordinary skill in the art using only routine experimentation.

Electronic assembly 2 is coupled to system bus 18. Electronic assembly 2 may include any circuit or combination of circuits. In an embodiment, electronic assembly 2 includes at least one processor 4 which may be of any type. In another embodiment, two or more processors 4 are included. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), or any other type of processor or processing circuit.

Other types of circuits that may be included in electronic assembly 2 are a custom circuit, an application-specific integrated circuit (ASIC), or the like, such as, for example, one or more circuits (such as a communications circuit 6) for use in wireless devices like cellular telephones, pagers, portable computers, personal digital assistants, two-way radios, and similar electronic systems. The ICs may perform any other type of function.

Electronic system 1 may also include an external memory 10, which in turn may include one or more memory elements suitable to the particular application, such as a main memory 12 in the form of random access memory (RAM), one or more hard drives 14, and/or one or more drives that handle removable media 16 such as floppy diskettes, compact disks (CDs), digital video disks (DVD), and the like.

Electronic system 1 may also include a display device 8, one or more speakers 9, and a keyboard and/or controller 20, which may include a mouse, trackball, game controller, voice-recognition device, or any other device that may permit a system user to input information into and receive information from the electronic system 1.

An electronic system 1 and/or data processing system that incorporates one or more electronic assemblies 2 that utilize an embodiment of the subject matter may reduce cooling problems associated with high performance IC packages, and such systems may therefore be more commercially attractive than other systems.

Figure 2:
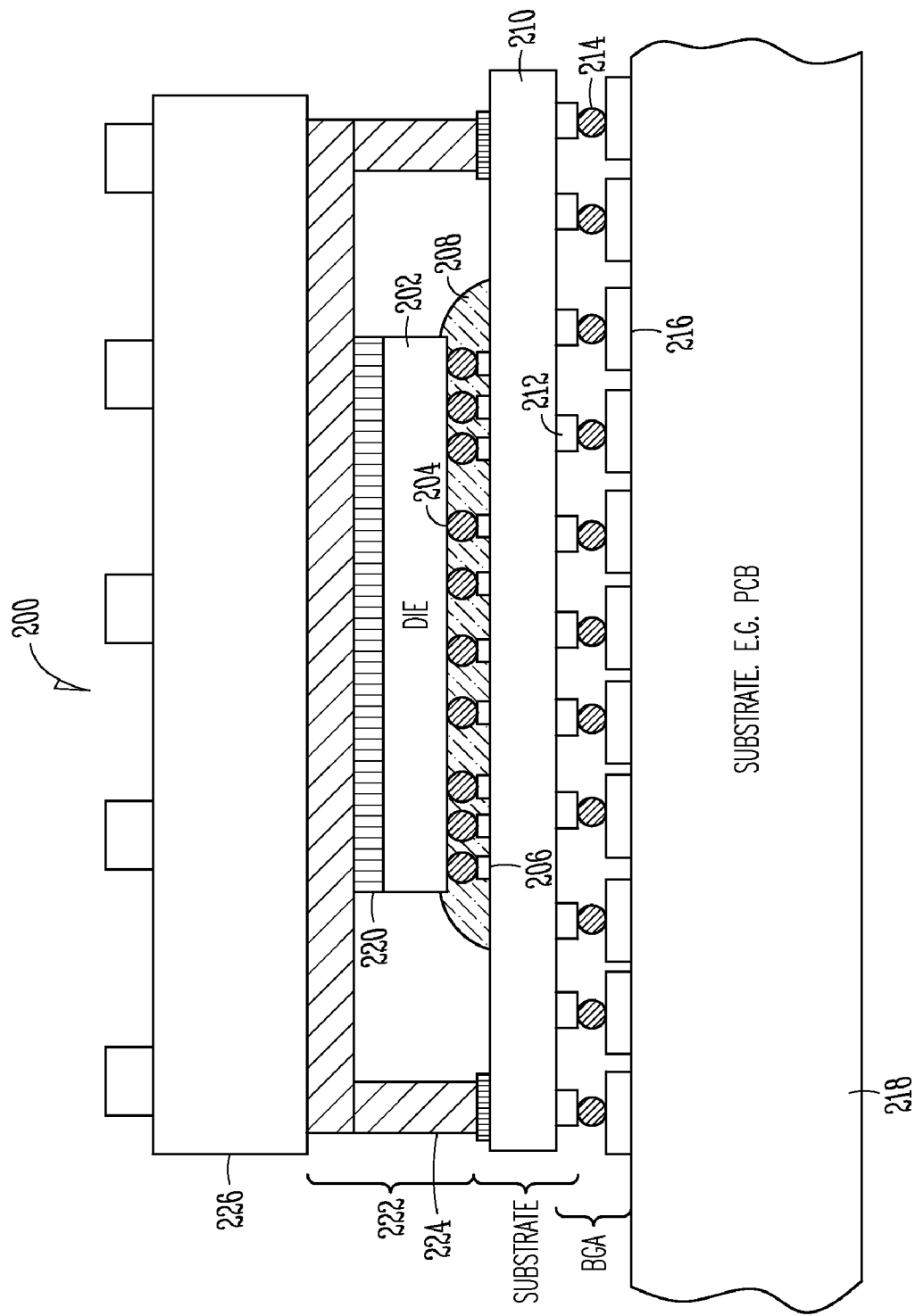
FIG. 2 illustrates a cross-sectional side view representation of a prior art IC package.

FIG. 2 illustrates a cross-sectional side view representation of a prior art IC package 200. IC package 200 represents a typical prior art structure that includes an IC die 202 mounted in "flip-chip" orientation with its lands (not shown) facing downward to couple with corresponding lands 206 on the upper surface of a substrate 210 through solder balls or bumps 204. A suitable underfill material 208 can be used to surround solder balls or bumps 204. Substrate 210 can be a one-layer board or a multi-layer board, and it can include additional lands 212 on its opposite surface for mating with additional packaging structure.

Substrate 210 can be of any type, including a multi-layer substrate. Substrate 210 can be mounted to an additional substrate 218, such as a printed circuit board (PCB) or card. Substrate 210 can comprise, for example, a plurality of lands 212 that can be mechanically and electrically coupled to corresponding lands 216 of substrate 218 by suitable connectors such as ball grid array (BGA) solder balls 214.

Die 202 generates its heat from internal structure, including wiring traces. Most of the heat is dissipated through its upper surface. Heat that is concentrated within die 202 is dissipated to a large surface that is in contact with die 202 in the form of a heat spreader 222 that is typically formed of metal such as copper or aluminum. Heat spreader 222 may have a side wall or support member 224. To improve the thermal conductivity between die 202 and the heat spreader 222, a TIM 220 is often provided between die 202 and heat spreader 222. The TIM 220 typically is a thermal gel or grease containing uniformly distributed metal particles.

To further dissipate heat from heat spreader 222, a heat sink 226 is often coupled to heat spreader 222. Heat sink 226 dissipates heat into the ambient environment.

An increase in the junction temperature $T_j$ of electronic devices on the IC can adversely affect the operating lives of the devices. Junction temperature is a function of three factors: junction-to-ambient thermal resistance, power dissipation, and ambient temperature. $T_j$ can be expressed by Equation 1:

$$T_j = (\theta_{ja} \times P_d) + T_a \quad \text{(Equation 1)}$$

wherein $T_j$=junction temperature (in degrees C.);
$\theta_{ja}$=the junction-to-ambient thermal resistance (in degrees C./watt);
$P_d$=power dissipation at $T_j$ (in watts); and
$T_a$=ambient temperature (in degrees C.).

The junction-to-ambient thermal resistance $\theta_{ja}$ can be represented by Equation 2:

$$\theta_{ja} = \theta_{jc} + \theta_{cs} + \theta_{sa} \quad \text{(Equation 2)}$$

wherein $\theta_{jc}$=the junction-to-case thermal resistance (in degrees C./watt);
$\theta_{cs}$=the case-to-sink thermal resistance (in degrees C./watt); and
$\theta_{sa}$=the sink-to-ambient thermal resistance (in degrees C./watt);

In the foregoing definitions, the pertinent location of the case is the top center of the IC package, including any IHS forming part of the IC package. The pertinent location of the sink can be the geometric center of the heat sink.

The IC package 200 of FIG. 2 is for most purposes no longer capable of meeting the thermal-dissipating requirements of today's high performance electronic assemblies, as expressed in terms of the junction-to-ambient thermal resistance $\theta_{ja}$.

Embodiments of the present invention may reduce the device junction temperature $T_j$ by reducing both the junction-to-case thermal resistance $\theta_{jc}$ and the case-to-sink thermal resistance $\theta_{cs}$. High performance processor assemblies have a very non-uniform power map or heat flux variation across the surfaces of the die. In a three-dimensional thermal mapping, hot spots appear as mountain peaks across the upper die surface, for example. It is the temperature of the highest flux area(s) that typically should be maintained at or below a specified value. While the silicon die provides some lateral heat spreading, it is insufficient to appreciably reduce the peak temperature(s).

Even the high thermal conductivity of copper (which is greater than three times that of silicon) is insufficient to handle the hot spots. If existing thermal dissipation structure is incapable of dissipating sufficient heat to maintain the die peak temperature below a specified value, the performance of the electronic assembly may have to be throttled back by reverting to a temperature-dependent processor power control process. Otherwise, the electronic assembly could malfunction or experience a catastrophic failure. Thus, with increased heat dissipation requirements for electronic assemblies, it is desirable to substantially improve the performance of TIMs.

Figure 3:
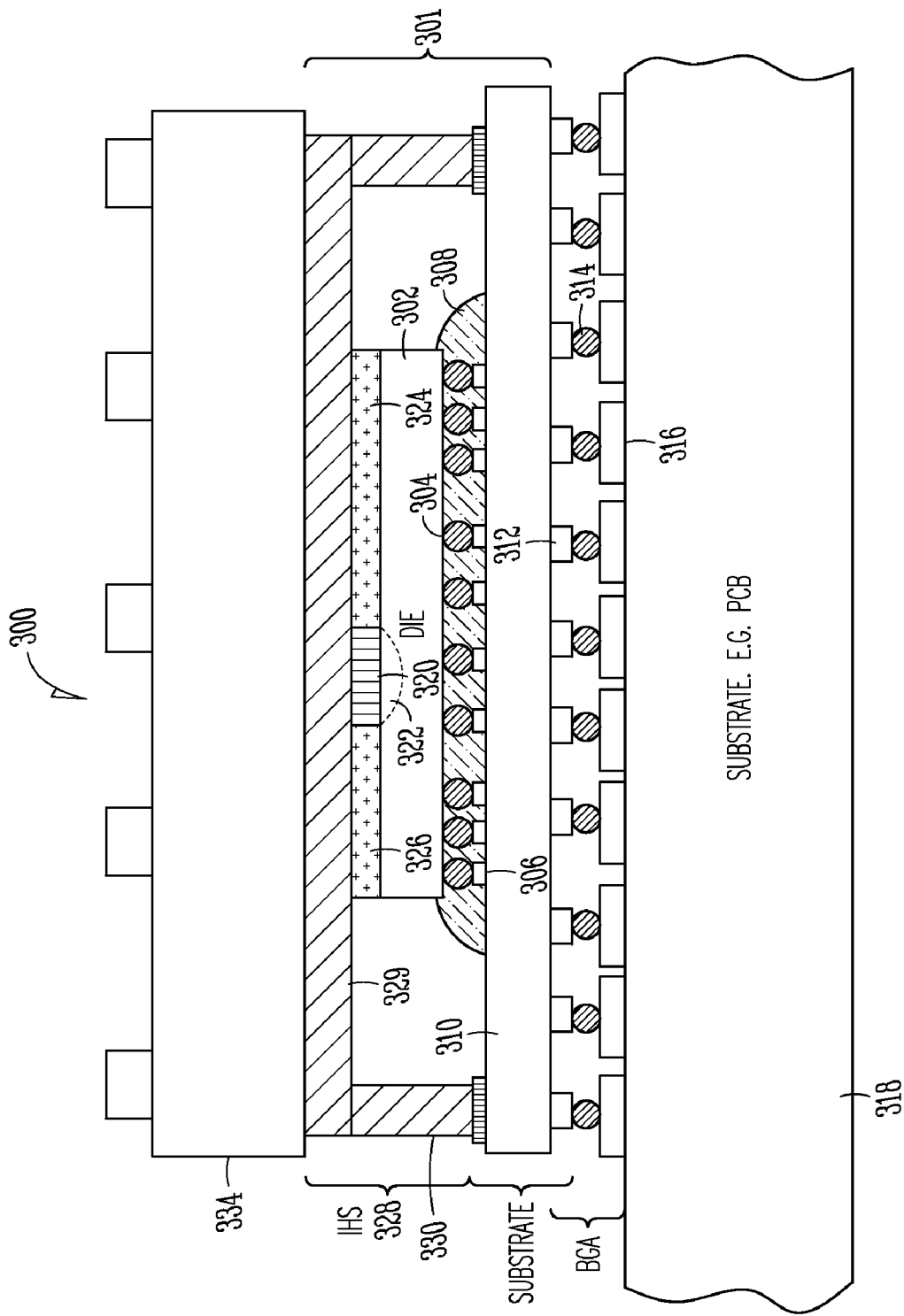
FIG. 3 illustrates a cross-sectional side view representation of an electronic assembly comprising an IC package with hot spot cooling, in accordance with an embodiment of the invention.

FIG. 3 illustrates a cross-sectional side view representation of an electronic assembly 300 comprising an IC package 301 with hot spot cooling, in accordance with an embodiment of the invention. The IC package 301 comprises a die 302 mounted on an organic land grid array (OLGA) substrate 310, and an integrated heat spreader (IHS) 328. While an OLGA substrate is shown, embodiments of the present invention are not limited to use with an OLGA substrate, and any other type of substrate can be employed. The IC package 301 illustrated in FIG. 3 can form part of electronic assembly 2 shown in FIG. 1. Die 302 can be of any type. In an embodiment, die 302 is a processor.

In FIG. 3, die 302 comprises a plurality of signal conductors (not shown) that terminate in electrical contacts or lands on the bottom surface (not shown) of die 302. These lands can be coupled to corresponding electrical contacts or lands 306 representing signal, power, or ground nodes on the upper surface of substrate 310 by appropriate connections such as controlled collapse chip connect ("C4") solder bumps 304. A suitable underfill 308, such as an epoxy material, can be used to surround C4 solder bumps 304 to provide mechanical stability and strength.

Still referring to FIG. 3, during operation, the die 302 may become warmer than the ambient air temperature. During operation, some regions of the die, referred to herein as "hot spots", may become relatively warmer than other regions of the die. Hot spot 322 is the warmest region of the die 302 during operation. In an embodiment, hot spot 322 may be a single region near the center of the top surface of the die 302. In another embodiment, hot spot 322 may extend across the top surface of the die 302 in one or more elongated oval or rectangular shapes. In other embodiments, the die 302 may have two or more hot spots 322.

An integrated heat spreader ("IHS") 328 may form a cover over die 302. IHS 328 is thermally coupled to an upper surface of die 302 through two or more TIMs 320, 324, and 326. Die 302 may thus dissipate a substantial amount of heat both laterally and vertically through two or more TIMs 320, 324, and 326 to IHS 328.

TIM 320 comprises a material that is capable of conducting heat at a high rate. In an embodiment, thermal interface 320 comprises a metal, such as solder. The solder may formed of material selected from the group consisting essentially of indium, tin, bismuth, aluminum, or copper. A layer of thermal interface 320 comprising solder has a high thermal conductivity in all directions within the layer. In other embodiments, thermal interface 320 may comprise other materials with thermal qualities that are only slightly inferior than those of solder.

TIMs 324 and 326 may comprise a material that is cheaper and less thermally conductive than that used in TIM 320. In an embodiment, TIMs 324 and 326 may comprise a phase-change polymer, such as polyolefin, wax, acrylic resin, polyester, or other crystalline and/or non-crystalline polymer combination. The phase-change polymer may be filled with thermally conductive particles such as aluminum, aluminum nitride, silica, boron nitride, silver, or other ceramic or metal particles.

In another embodiment, TIMs 324 and 326 may comprise a gel-type polymer or grease-type polymer (e.g. silicone polymer), or a B-stage polymer film (e.g., epoxy, silicone, or other die adhesive), or a high cross-linked elastomer (e.g., silicone pad, or urethane). These TIMs 324 and 326 may be filled with thermally conductive particles such as those mentioned above.

One or more TIMs 324 and 326 may be positioned between the die 302 and the lid 329 in the region surrounding TIM 320. In an embodiment, TIMs 324 and 326 may be identical. In other embodiments, they may be different.

In an embodiment in which a hot spot is relatively small, a relatively thin layer of solder material may be used for TIM 320. The thin layer improves thermal transfer. In an embodiment, the solder material may comprise indium. One or more polymers may be used for TIMs 324 and 326 out to the edge of die 302. The polymer material may be more ductile than the solder material, so that the package reliability may be improved over an embodiment in which a thin layer of indium is used for the entire TIM between the die 302 and the IHS 328, because of the tendency for a thin layer of indium to crack. In order to improve fatigue reliability, the material used in TIMs 320, 324, and 326 should have similar or identical coefficients of thermal expansion ("CTE") to reduce Z-direction plastic thermal strain.

Using a thin layer of TIM 320, 324, and 326 may allow the package bond line thickness ("BLT") to be significantly reduced. In an embodiment, the BLT may be reduced from approximately 200 microns to approximately 45 microns. This may allow the thermal resistance above a die hot spot to be reduced by as much as 15% in an embodiment. Thermal resistance is proportional to BLT in the Z direction, so a thinner BLT will result in reduced thermal resistance.

A layer of TIM, such as a solder material, may be both relatively thin and relatively small in size, because a die hot spot may typically be only 10% of the die area. If the solder material is relatively expensive, as in the case of indium, the potential cost of solder material could be reduced by 90%.

The integrated heat spreader includes a lid 329 and a side wall or support member 330. Two or more TIMs 320, 324, and 326 may be in contact with the lower surface of lid 329 and with the upper surface of die 302. In an embodiment, the two or more TIMs 320, 324, and 326 are affixed to die 302 and/or to lid 329.

TIM 320 can be positioned in several different ways. For example, TIM 320 can be placed on the upper surface of die 302 or on the lower surface of lid 329. Alternatively, TIMs 320, 324, and 326 can be formed as a single preformed unit and subsequently affixed to lid 329 of the integrated heat spreader 328 or to the upper surface of die 302. Alternatively, TIMs 320, 324, and 326 may be formed as a plurality of preformed units. To further increase the rate of heat dissipation from the integrated heat spreader 328, a heat sink 334 of any suitable shape, material, and size can optionally be coupled to or formed as part of the upper surface of the lid 329 of IHS.

OLGA substrate 310 can be of any type, including a multi-layer substrate. OLGA substrate 310 can be mounted to an additional substrate 318, such as a printed circuit board (PCB) or card. OLGA substrate 310 can comprise, for example, a plurality of lands 312 that can be mechanically and electrically coupled to corresponding lands 316 of substrate 318 by suitable connectors such as ball grid array (BGA) solder balls 314.

While a BGA arrangement is illustrated in FIG. 3 for coupling OLGA substrate 310 to substrate 318, embodiments of the present invention are not limited to use with a BGA arrangement, and they can be used with any other type of packaging technology. Further, the inventive subject matter is not to be construed as limited to use in C4 packages, and it can be used with any other type of IC package where the herein-described features of the inventive subject matter provide an advantage.

Figure 4:
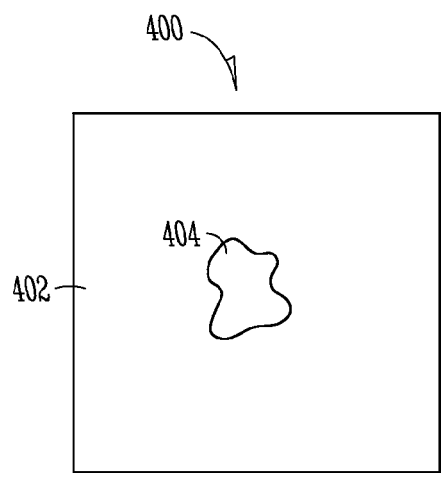
FIG. 4 illustrates a top view representation of an IC die.

FIG. 4 illustrates a top view representation of an IC die 400.

IC die 400 may be of any suitable type. IC die 400 may be identical or similar to the IC die 302 described in FIG. 3. In an embodiment, IC die 400 may be a processor.

A hot spot 404 is located on a top surface 402 of the IC die 400. The location of hot spots may vary in accordance with the design and function of the die. Although the hot spot 404 is shown as a single region near the center of the top surface 402, the hot spot 404 may be of any shape and may be located in any region of the top surface 402. In an embodiment, hot spot 404 may be approximately circular and may be located near the center of the top surface 402 of die 400 as shown in FIG. 4. In other embodiments, described later, the hot spot may be shaped differently.

Figure 5:
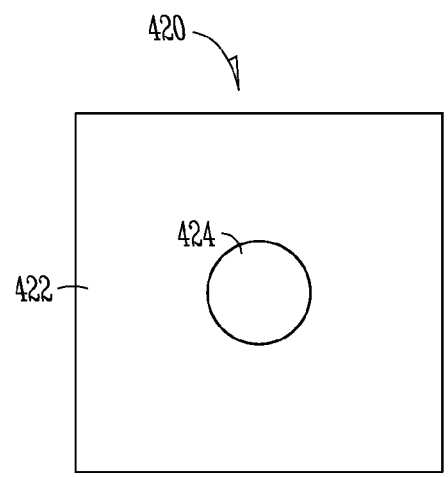
FIG. 5 illustrates a top view representation of a layer of TIMs for an IC die with hot spot cooling, in accordance with an embodiment of the invention.

FIG. 5 illustrates a top view representation of a layer 420 of TIMs for an IC die with hot spot cooling, in accordance with an embodiment of the invention. The layer 420 of TIMs shown in FIG. 5 is for an IC die with a hot spot 404 located near the center of the top surface 402 of the die 400, as shown in FIG. 4.

A more thermally conductive material 424 is to be positioned over the hot spot 404 on the top surface 402 of the IC die 400. The more thermally conductive material 424 may be any suitable material. In an embodiment, the more thermally conductive material 424 may comprise solder. The solder may formed of material selected from the group consisting essentially of indium, tin, bismuth, aluminum, or copper.

Although the more thermally conductive material 424 is shown having an approximately circular shape and located near the center of the top surface 402 of the die 400, it may be any suitable shape and may be located on any suitable region of the die.

A less thermally conductive material 422 may be positioned abutting or surrounding the more thermally conductive material 424. In an embodiment, the less thermally conductive material 422 may comprise polymer.

In an alternative embodiment, the less thermally conductive material 422 may comprise a solder that is relatively less expensive than the solder used for the more thermally conductive material 424. For example, the more thermally conductive material 424 may comprise indium, whereas the less thermally conductive material 422 may comprise a tin-lead solder.

Figure 6:
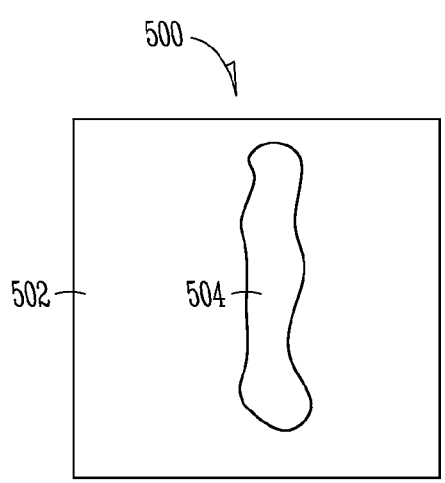
FIG. 6 illustrates a top view representation of an IC die.

FIG. 6 illustrates a top view representation of an IC die 500. IC die 500 may be of any suitable type. IC die 500 may be identical or similar to the IC die 302 described in FIG. 3. In an embodiment, IC die 500 may be a processor.

A hot spot 504 is located on a top surface 502 of IC die 500. In an embodiment, hot spot 504 may be approximately rectangular. In another embodiment, hot spot 504 may extend from a region at or near an edge of the top surface 502 of IC die 500 to a region at or near the opposite edge of the top surface 502, as shown in FIG. 6.

Figure 7:
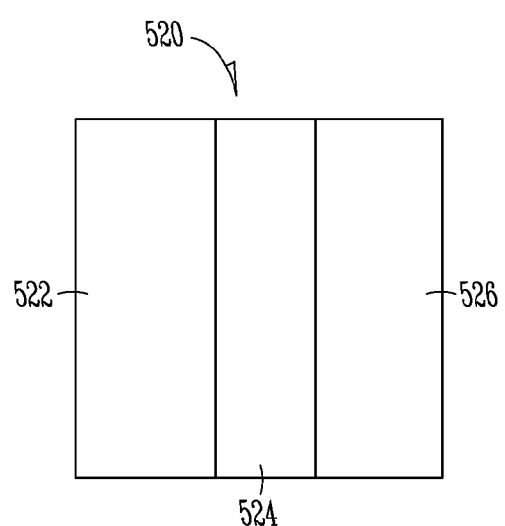
FIG. 7 illustrates a top view representation of a layer of TIMs for an IC die with hot spot cooling, in accordance with an embodiment of the invention.

FIG. 7 illustrates a top view representation of a layer 520 of TIMs for an IC die with hot spot cooling, in accordance with an embodiment of the invention. The layer 520 of TIMs shown in FIG. 7 is for an IC die with a hot spot 504 located in a region extending from approximately one edge of the top surface 502 to approximately the opposite edge, as shown in FIG. 6.

A more thermally conductive material 524 is to be positioned over the hot spot 504 on the top surface 502 of the IC die 500. The more thermally conductive material 524 may be any suitable material. In an embodiment, the more thermally conductive material 524 may comprise solder. Although the more thermally conductive material 524 is shown as an approximately rectangular shape, it may be of any suitable shape. The more thermally conductive material 524 may be located on any suitable region of the top surface 502 of the die 500. Furthermore, although the more thermally conductive material 524 shown in FIG. 7 may be used to cover a single hot spot similar to hot spot 504 in FIG. 6, a more thermally conductive material 524 may be used to cover any contiguous region on the top surface 502 of the die containing multiple hot spots (not shown).

Still referring to FIG. 7, less thermally conductive materials 522 and 526 may be positioned abutting or surrounding the more thermally conductive material 524. The less thermally conductive materials 522 and 526 may be of any suitable type. The less thermally conductive materials 522 and 526 may be identical, but need not be. In an embodiment, the less thermally conductive materials 522 and 526 may comprise polymers. In an alternative embodiment, one or more of the less thermally conductive materials 522 and 526 may comprise a relatively inexpensive solder.

FIG. 8 illustrates a top view representation of an IC die 600. IC die 600 may be of any suitable type. IC die 600 may be identical or similar to the IC die 302 described in FIG. 3. In an embodiment, IC die 600 may be a processor.

Hot spots 604, 606, and 608 are located on a top surface 602 of IC die 600. In an embodiment, one or more of hot spots 604, 606, and 608 may be similar in size. In another embodiment, one or more of hot spots 604, 606, and 608 may be relatively hotter than the other hot spots.

FIG. 9 illustrates a top view representation of a layer 620 of TIMs for an IC die with hot spot cooling, in accordance with an embodiment of the invention. The layer 620 of TIMs shown in FIG. 9 corresponds to an IC die with multiple hot spots 604, 606, and 608, as shown in FIG. 8.

More thermally conductive materials 624, 626, and 628 are to be positioned over the hot spots 604, 606, and 608 on the top surface 602 of the IC die 600. The more thermally conductive materials 624, 626, and 628 may be any suitable material. In an embodiment, the more thermally conductive materials 624, 626, and 628 may comprise solder. In an alternative embodiment, the compositions of the more thermally conductive materials 624, 626, and 628 may not be identical.

Although the more thermally conductive materials 624 and 628 are shown as approximately circular shapes, they may be of any suitable shape. Although the more thermally conductive material 626 is shown as an approximately rectangular shape, it may be of any suitable shape. The more thermally conductive materials 624, 626, and 628 may be located on any suitable region of the top surface 602 of the die.

Still referring to FIG. 9, a less thermally conductive material 622 may be positioned abutting or surrounding the more thermally conductive materials 624, 626, and 628. The less thermally conductive material 622 may be of any suitable composition. In an embodiment, the less thermally conductive material 622 may be a polymer or a relatively inexpensive solder.

FIG. 10 illustrates a top view representation of an IC die 700. IC die 700 may be of any suitable type. IC die 700 may be identical or similar to the IC die 302 described in FIG. 3. In an embodiment, IC die 700 may be a processor.

A hot spot 704 is located on a top surface 702 of IC die 700. In an embodiment, hot spot 704 may be approximately circular with a narrow region extending outward, as shown in FIG. 10. In another embodiment, hot spot 704 may be approximately oval in shape during certain operations of the die, and it may have a region that becomes relatively hotter during other operations of the die. As a result, the shape of the hot spot 704 may vary in accordance with operation of the die.

FIG. 11 illustrates a top view representation of a layer 720 of TIMs for an IC die with hot spot cooling, in accordance with an embodiment of the invention. The layer 720 of TIMs shown in FIG. 11 is for an IC die with a hot spot 704 that varies in shape with operation of the die, as shown in FIG. 10.

More thermally conductive materials 724 and 726 are to be positioned over the hot spot 704 on the top surface 702 of the IC die 700. The more thermally conductive materials 724 and 726 may be any suitable material. In an embodiment, the more thermally conductive materials 724 and 726 may comprise solder. In an alternative embodiment, the compositions of the more thermally conductive materials 724 and 726 may vary depending upon their positions relative to the hotter portion of die hot spot 704.

Although the more thermally conductive material 724 is shown as an approximately circular shape, it may be of any suitable shape. Although the more thermally conductive material 726 is shown as an approximately rectangular shape, it may be of any suitable shape. The more thermally conductive materials 724 and 726 may be located on any suitable region of the top surface 702 of the die.

Still referring to FIG. 11, a less thermally conductive material 722 may be positioned abutting or surrounding the more thermally conductive materials 724 and 726. The less thermally conductive material 722 may be of any suitable type. In an embodiment, the less thermally conductive material 722 may be a polymer or a relatively inexpensive solder.

The fabrication of an IC package having hot spot cooling with two or more TIMs between a die and a heat spreader will now be described.

Figure 12:
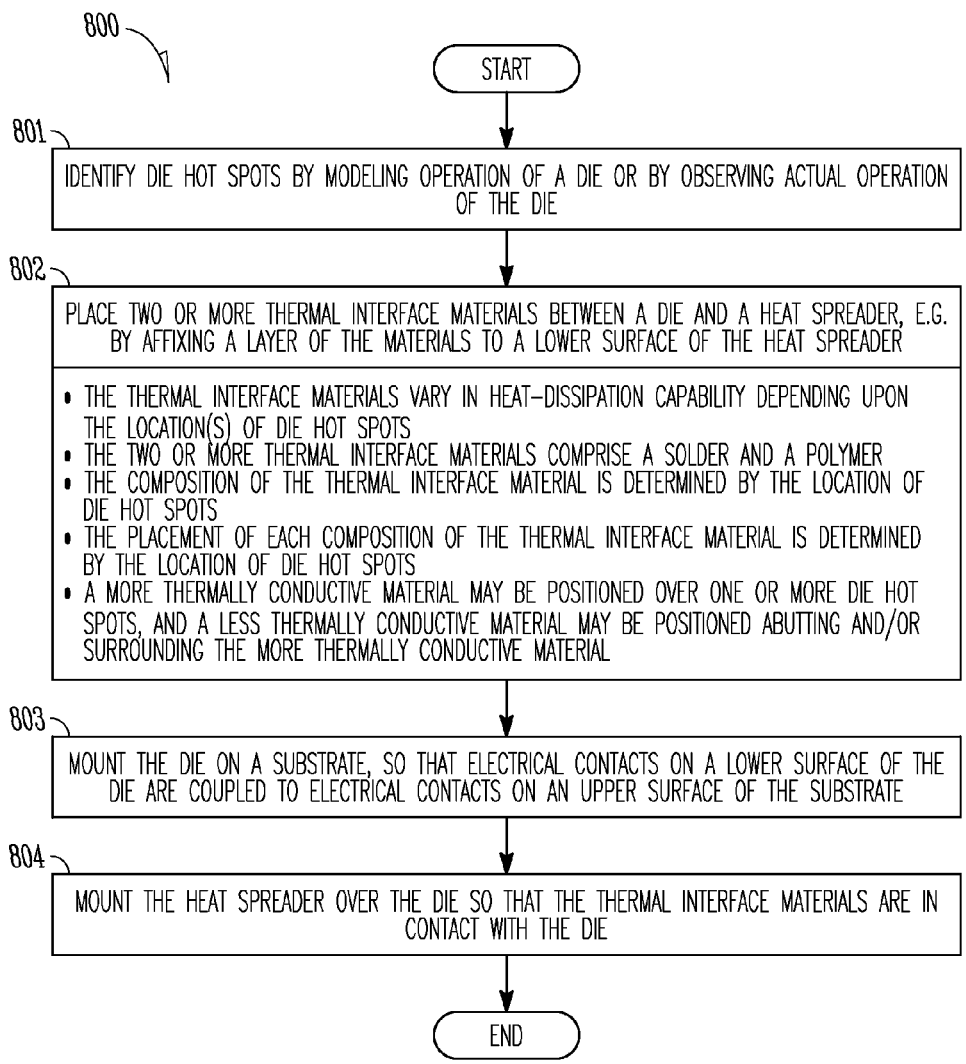
FIG. 12 is a flow diagram of several alternative methods of fabricating a hot spot cooling IC package, in accordance with various embodiments of the subject matter.

FIG. 12 is a flow diagram 800 of several alternative methods of fabricating a hot spot cooling IC package, in accordance with various embodiments of the subject matter.

In 801, die hot spots are identified. The hot spots may be identified by modeling operation of the die. Alternatively, hot spots could be identified by observing actual operation of the die. The location of the hot spots may vary in accordance with the design and function of the die. In an embodiment, the hot spots may be located in a concentrated region near the center of the top surface of the die, as in hot spot 404 of FIG. 4. In another embodiment, the hot spots may be located in two or more separate regions near the top surface of the die, as in hot spots 604, 606, and 608 of FIG. 8. In another embodiment, the hot spots may be located in a region that is approximately oval or rectangular in shape when viewed from the top surface of the die, as in hot spot 504 of FIG. 6. The die hot spots may vary in temperature during operation of the die. The hot spots may vary in shape during operation of the die. In an embodiment having multiple die hot spots, as in hot spots 604, 606, and 608 of FIG. 8, one or more of the die hot spots may be relatively hotter than the other die hot spots.

In 802, two or more TIMs are placed between a die and a heat spreader. In an embodiment, this may be accomplished by affixing a layer of the two or more separate materials to a lower surface of the heat spreader or to an upper surface of the die.

In an alternative embodiment, this may be accomplished by affixing a preformed composite TIM containing each of the two or more materials positioned relative to one another in a manner suitable for the particular application.

The TIM may comprise a single preformed unit, or it may comprise a plurality of preformed units. For example, a first preformed unit of a relatively higher thermally conductive material may be positioned and/or affixed with respect to the heat spreader or die. Concurrently or subsequently, one or more additional preformed units of a relatively lower thermally conductive material may be positioned and/or affixed with respect to the heat spreader or die.

The TIMs may vary in heat-dissipation capability depending upon the locations of die hot spots.

The two or more TIMs may comprise a solder and a polymer. The composition of the TIM is determined by the location of die hot spots. The placement of each composition of the TIM is determined by the location of die hot spots.

A more thermally conductive material may be positioned over one or more die hot spots, and a less thermally conductive material may be positioned abutting and/or surrounding the more thermally conductive material. A more thermally conductive material may be seen, for example, in more thermally conductive material 424 of FIG. 5 which is positioned over hot spot 404 of FIG. 4. A less thermally conductive material may be seen, for example, in less thermally conductive material 422 of FIG. 5. In an embodiment, there may be multiple hot spots on the surface of the die, as shown in hot spots 604, 606, and 608 of FIG. 8, and a more thermally conductive material may be positioned over each hot spot, as shown in more thermally conductive materials 624, 626, and 628 of FIG. 9.

In 803, the die is mounted on a substrate. In an embodiment, electrical contacts on a lower surface of the die are coupled to electrical contacts on an upper surface of the substrate. An example of a die mounted on a substrate may be seen, for example, in FIG. 3, where the electrical contacts on a lower surface of the die (not shown) are coupled to electrical contacts 306 on an upper surface of the substrate 310 by solder balls or bumps 304.

The conductive bumps or balls may be formed of any suitable conductive material. For example, they may be formed of material selected from the group consisting essentially of aluminum, antimony, bismuth, copper, gallium, gold, indium, lead, nickel, silver, tin, zinc, or alloys thereof. In an embodiment, the material may be lead-free. In another embodiment, it may be lead-bearing.

In 804, the heat spreader is mounted over the die so that the TIMs are in contact with the die. An example of the heat spreader mounted over the die may be seen, for example, in FIG. 3, where the heat spreader lid 329 is shown in contact with TIMs 320, 324, and 326.

The operations described above with respect to the methods illustrated in FIG. 12 may be performed in a different order from those described herein. Although the flow diagram of FIG. 12 shows an "End", it may be performed continuously if desired.

The above-described choice of materials; geometry; number, order, dimensions, and composition of structural elements; fabrication operations; and assembly sequencing may all be varied by one of ordinary skill in the art to optimize the performance characteristics of the package.

Any suitable method, or combination of different methods, for performing the operations of FIG. 12 may be used.

The resulting IC package is flexible in terms of the orientation, size, number, order, and composition of its constituent elements. Various embodiments of the subject matter may be implemented using various combinations of substrate and component technologies, choice of materials, and fabrication operations, to achieve the advantages of the inventive subject matter. The structure, including types of materials used, dimensions, layout, geometry, and so forth, of the IC package may be built in a wide variety of embodiments, depending upon the requirements of the electronic assembly of which it forms a part.

FIGS. 1-11 are merely representational and are not drawn to scale. Certain proportions thereof may be exaggerated, while others may be minimized. FIGS. 1-12 are intended to illustrate various embodiments of the subject matter that can be understood and appropriately carried out by those of ordinary skill in the art.

The inventive subject matter provides for an electronic package, such as an IC package, an electronic assembly, an electronic system, and methods of manufacture thereof that may minimize hot spot cooling problems associated with high-performance electronic packages. Otherwise, the electronic package may experience reliability problems, and the associated electronic assembly may malfunction or even experience a catastrophic failure.

Other embodiments will be readily apparent to those of ordinary skill in the art after reading this disclosure.

While certain operations have been described herein relative to "upper" and "lower" surfaces, it will be understood that these descriptors are relative, and that they would be reversed if the IC package were inverted. Therefore, these terms are not intended to be limiting.

Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the subject matter. Therefore, it is manifestly intended that embodiments of the subject matter be limited only by the claims and the equivalents thereof.

It is emphasized that the Abstract is provided to comply with 37 C.F.R. § 1.72(b) requiring an Abstract that will allow the reader to ascertain the nature and gist of the technical disclosure. It is submitted with the understanding that it will not be used to interpret or limit the scope or meaning of the claims.

In the foregoing Detailed Description, various features are occasionally grouped together in a single embodiment for the purpose of streamlining the disclosure. This method of disclosure is not to be interpreted as reflecting an intention that the claimed embodiments of the subject matter require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

What is claimed is:

1. An integrated circuit package comprising:
a substrate having at least one die on a surface thereof;
a heat spreader positioned over the at least one die, the heat spreader having a surface area larger than a surface area of the at least one die; and
a thermal interface material positioned between the heat spreader and the at least one die, the thermal interface material varying in composition according to its X-Y location, wherein the thermal interface material comprises solder positioned over die hot spots, and wherein the thermal interface material further comprises a polymer material abutting the solder.

2. The package recited in claim 1, wherein the composition of the thermal interface material varies according to the die hot spots.

3. The package recited in claim 1, wherein the thermal interface material comprises at least two materials having different thermal characteristics.

4. The package recited in claim 1, wherein the polymer is from the group consisting of a phase-change polymer, a gel-type polymer, a grease-type polymer, and a high cross-linked elastomer.

5. The package recited in claim 1, wherein the polymer comprises thermally conductive metallic or ceramic particles.

6. The package recited in claim 1, wherein the polymer is positioned over regions of the at least one die that are relatively cooler than the die hot spots when the die is in operation.

7. The package recited in claim 1, wherein the polymer material surrounds the solder.

8. An electronic assembly comprising:
at least one integrated circuit package having
a substrate;
at least one die positioned on a surface of the substrate; and
a lid positioned over the at least one die; and
a thermal interface material placed between the lid and the at least one die, the thermal interface material having two or more regions of differing composition, wherein at least one of the regions comprises a solder region positioned over at least one die hot spot and wherein at least one of the regions comprises a polymer region abutting the solder region.

9. The assembly recited in claim 8, wherein the thermal interface material comprises a plurality of polymers.

10. The assembly recited in claim 8, wherein the at least one polymer region is positioned over a region of the at least one die that is relatively cooler than the die hot spots when the die is in operation.

11. A structure comprising:
a composite thermal interface material comprising two or more regions of differing composition, wherein at least one of the regions comprises a solder region to be positioned over at least one die hot spot, and wherein at least one of the regions comprises a polymer region abutting the solder region.

12. The structure recited in claim 11, wherein the composite thermal interface material comprises solder and a polymer, wherein the polymer is from the group consisting of a phase-change polymer, a gel-type polymer, a grease-type polymer, and a high cross-linked elastomer.

13. The structure recited in claim 11, wherein the composite thermal interface material is preformed either as one unit or as a plurality of units.

* * * * *